(12) United States Patent
Buynoski et al.

(10) Patent No.: US 6,624,037 B2
(45) Date of Patent: Sep. 23, 2003

(54) XE PREAMORPHIZING IMPLANTATION

(75) Inventors: Matthew Stephen Buynoski, Palo Alto, CA (US); Che-Hoo Ng, San Martin, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 50 days.

(21) Appl. No.: 09/918,794

(22) Filed: Aug. 1, 2001

(65) Prior Publication Data
US 2003/0027381 A1 Feb. 6, 2003

(51) Int. Cl.[7] ............................................. H01L 21/336
(52) U.S. Cl. ....................... 438/305; 438/306; 438/308; 438/162; 438/163; 438/166
(58) Field of Search .................... 438/149, 162, 438/166, 300, 482, 486, 528, 305, 306, 308, 163

(56) References Cited

U.S. PATENT DOCUMENTS

| 4,584,026 | A |   | 4/1986 | Wu et al. |
| 5,953,615 | A |   | 9/1999 | Yu |
| 6,074,937 | A |   | 6/2000 | Pramanick et al. |
| 6,191,012 | B1 |  | 2/2001 | Ng et al. |
| 6,225,176 | B1 |  | 5/2001 | Yu |
| 6,403,433 | B1 | * | 6/2002 | Yu et al. ..................... 438/300 |

* cited by examiner

*Primary Examiner*—Olik Chaudhuri
*Assistant Examiner*—Khiem Nguyen

(57) ABSTRACT

A SOI substrate is preamorphized by ion implanting Xe prior to forming source/drain extensions and source/drain regions, thereby virtually eliminating or significantly reducing floating body effects. Other aspects comprise ion implanting a $Xe_2^+$ into a bulk silicon or SOI substrate to effect preamorphization prior to forming source/drain extensions and regions having shallow junctions with reduced vertical and lateral straggle.

20 Claims, 7 Drawing Sheets

XE PREAMORPHIZING IMPLANTATION

TECHNICAL FIELD

The present invention relates generally to manufacturing semiconductor devices, particularly highly miniaturized semiconductor devices having ultra-shallow junction depths.

BACKGROUND ART

The semiconductor manufacturing techniques undergo constant challenges as design features continue to plunge deeper into the submicron regime, as in fabricating devices having a design rule of about 0.12 micron and under. The accurate formation of ultra-shallow junction depths ($X_j$) having high reliability in an efficient manner poses a particularly challenging problem.

Preamorphization techniques, as by ion implanting silicon (Si) or germanium (Ge), to define the contours of source/drain regions prior to dopant implantation and annealing have been employed to reduce the channeling effect and reduce transient enhanced diffusion (TED), and to reduce the activation temperature. Such preamorphization (SPE) techniques, however, are not without disadvantageous consequences. For example, implanted Si and Ge ions tend to migrate beyond the intended source/drain regions resulting in what is referred to as implantation straggle, both vertically and horizontally, making it extremely difficult to precisely define ultra-shallow source/drain extensions, e.g., below 400 Å.

As the design rules plunge into the deep sub-micron range, the channel length, i.e., distance between junctions across the channel, evolves as a critical dimension, particularly as the channel length is reduced to about 1000 Å and under. Natural variations in junction position as well as variations arising from processing render it difficult to accurately design devices. Alteration of a doping profile from TED as well as implantation straggle exacerbate design problems.

Conventional silicon-on-insulator (SOI) types of substrates have evolved and basically comprise a substrate, a buried oxide layer thereon, and a semiconductor layer on the buried oxide layer which constitutes the "body" of the transistor. In such SOI devices, the body floats in that there is no direct electrical connection to it. As the source and drain regions are isolated from the substrate, junction capacitance is reduced, i.e., when an electrical signal changes on either or both source and drain, there is significantly less capacitive coupling to the substrate. As electrical isolation is facilitated employing an SOI substrate, certain electrical elements of the circuit can be positioned closer together, thereby reducing the die size. SOI structures also offer the advantage of more rapid switching. In addition, latchup, which typically occurs in standard CMOS devices, does not exist employing SOI substrates, since the substrate is isolated by the buried oxide. Static or plasma arcing is also reduced in SOI derives.

There are, however, disadvantages attendant upon employing SOI substrates in fabricating semiconductor devices. A notable disadvantage is what is referred to as "floating body effects". For example, it takes a considerable period of time for an ejected charge to leak out. As a result, transient bipolar effects can occur wherein a parasitic bypolar transistor turns on parallel to the MOSFET. In addition, hysteresis effects can occur.

There exists a need for efficient methodology to fabricate semiconductor devices having accurate ultra-shallow junctions. There also exists a need for efficient methodology to fabricate semiconductor devices having accurate ultra-shallow junctions based upon SOI substrates without floating body effects.

DISCLOSURE OF THE INVENTION

An advantage of the present invention is a method of manufacturing a semiconductor device having an SOI structure with reduced floating body effects.

Another advantage of the present invention is a method of manufacturing a semiconductor device having ultra-shallow junctions and accurately formed source/drain extensions and regions.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a silicon-on-insulator (SOI) structure comprising: a lower silicon substrate; a buried insulating layer on the substrate; and an upper layer of crystalline silicon on the insulating layer; ion implanting xenon (Xe) into the upper silicon layer to form an amorphous region therein extending from an upper surface toward the buried insulating layer; ion implanting dopant impurities to form source/drain extension implants and source/drain implants; and annealing to activate shallow source/drain extensions and source/drain regions, and to crystallize the amorphous region.

Embodiments of the present invention comprise forming an SOI structure with a silicon oxide buried insulating layer, ion implanting Xe at an implantation dosage of about $1 \times 10^{14}$ to about $5 \times 10^{14}$ ions/cm$^2$ and an implantation energy of about 1 KeV to about 200 KeV. Embodiments of the present invention comprise annealing at a temperature of about 500° C. to about 650° C., e.g., about 550° C. to about 600° C., to activate source/drain extensions and, the source/drain regions, and to recrystallize amorphous regions caused by Xe ion implantation. Embodiments of the present invention include forming the source/drain extensions prior to forming the source/drain regions, and also include removable spacer techniques wherein the source/drain regions are formed prior to the source/drain extensions.

Another aspect of the present invention is a method of manufacturing a semiconductor device, the method comprising: providing an ion beam consisting essentially of xenon dimer ($Xe_2^+$); implanting the $Xe_2^+$ into a crystalline semiconductor substrate to form an amporhous region therein; ion implanting dopant impurities into the amorphous region to form source/drain extensions and source/drain implants; and annealing to activate the source/drain extensions and source/drain regions, and to recrystallize the amorphous region.

Embodiments include analyzing a first Xe ion beam and selectively extracting the $Xe_2^+$ beam therefrom. Embodiments of the present invention comprise ion implanting the $Xe_2^+$ into a substrate, inclusive of bulk silicon and SOI substrates, to preamorphize regions prior to ion implanting dopant impurities, followed by annealing at a temperature of about 500° C. to about 650° C. Embodiments of the present invention comprise ion implanting $Xe_2^+$ into a bulk silicon substrate forming amorphous regions having a depth no greater than about 250 Å, e.g., to about 100 Å to about 250 Å; and then forming source/drain extensions and source/drain regions with intermediate annealings at a temperature of about 500° C. to about 650° C.

Additional advantages of the present invention will become readily apparent to those skilled in the art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

The present invention provides enabling methodology for fabricating semiconductor devices having well defined ultra-shallow junctions by significantly reducing vertical and lateral straggle, particularly in semiconductor devices having an SOI substrate. The present invention also provides efficient methodology for fabricating semiconductor devices having well defined ultra-shallow junctions using Xe ion implantation, particularly by ion implanting $Xe_2^+$. The present invention further provides methodology enabling the fabrication semiconductor devices comprising an SOI substrate with significantly reduced floating body effects.

The precise mechanism underlying the advantageous reduction in floating body effects in SOI type structures by employing Xe ion implantation for preamorphization prior to forming the source/drain extensions and source/drain regions is not known with certainty. However, it is believed that the combination of high atomic weight and large ionic size for Xe vis-à-vis elements such as Ge and Si, and the reduced lateral and vertical straggle, facilitate both dopant activation and Xe inclusion in the recrystallized lattice in some manner so as to virtually eliminate or significantly reduce floating body effects without the excessive leakage currents usually caused by crystal damage from ion implantation.

Embodiments of the present comprise implanting Xe ions into an upper crystalline layer of an SOI structure comprising a substrate, buried insulating layer such as silicon oxide, and the upper crystalline layer thereon, to preamorphize the upper silicon layer. Sequential ion implantations and annealings are then conducted to form the source/drain extensions and source/drain regions utilizing sidewall spacers on the gate electrode. Advantageously, activation annealing after Xe ion implantation can be conducted at a relatively low temperature of about 500° C. to about 650° C. vis-à-vis conventional activation temperatures of about 800° C. to about 1,050° C. Accordingly, embodiments of the present invention include forming the source/drain extensions before or after forming the source/drain regions.

Embodiments of the present invention include forming a gate electrode structure on the upper crystalline silicon layer of an SOI substrate and then ion implanting Xe to amorphize the upper silicon layer down to the buried insulating layer, as by ion implanting Xe at an implantation dosage of about $1 \times 10^{14}$ to about $5 \times 10^{14}$ ions/cm$^2$ and an implantation energy of about 1 KeV to about 200 KeV, e.g., about 10 KeV to about 130 KeV.

Figure 1:
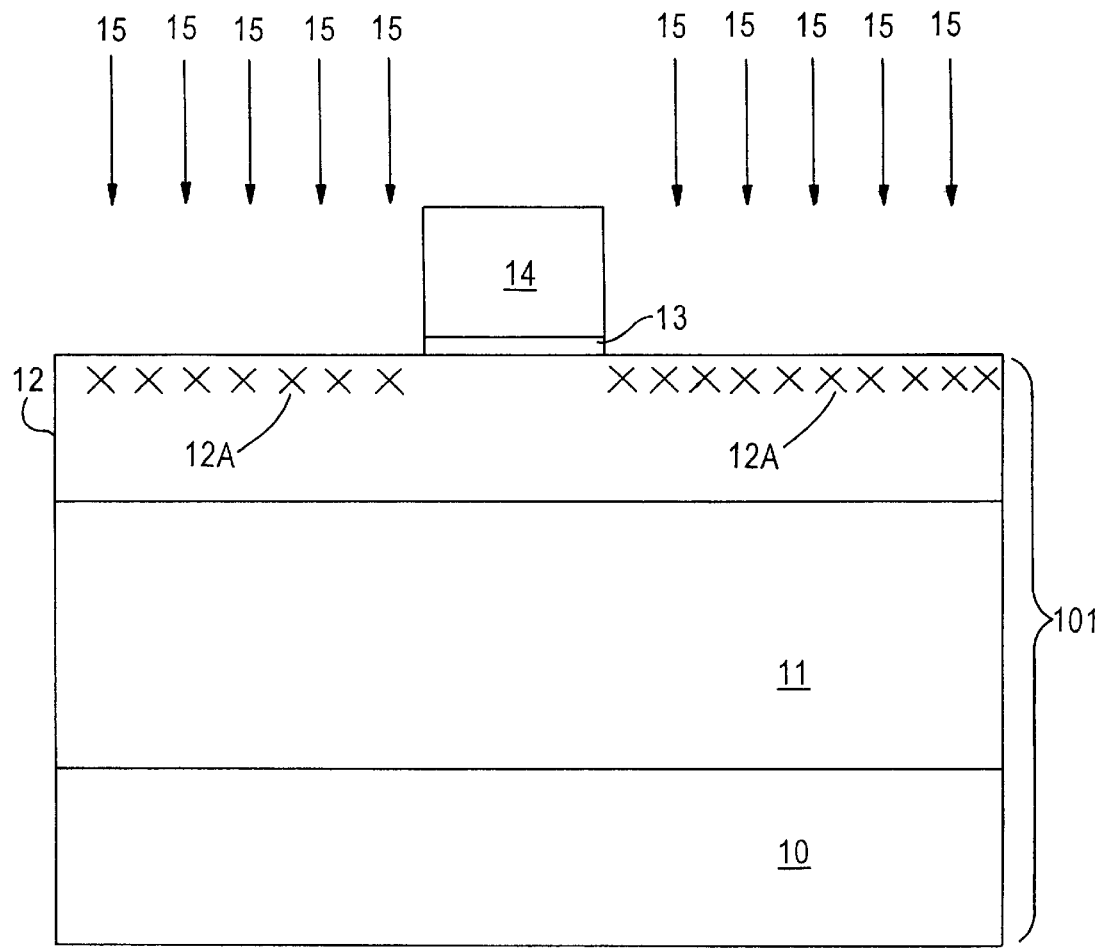
FIGS. 1 through 4 schematically illustrate sequential phases of a method in accordance with an embodiment of the present invention.
Figure 2:
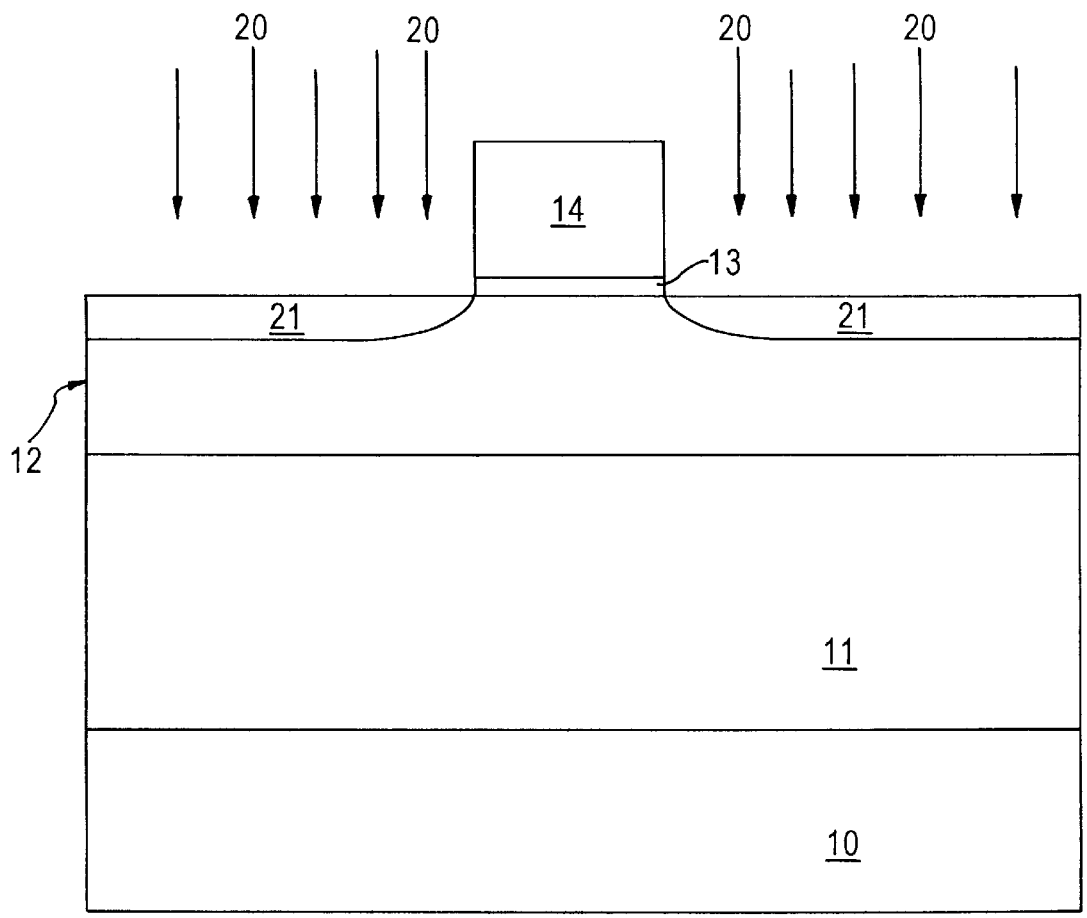

A method in accordance with an embodiment with the present invention is schematically illustrated in FIGS. 1 through 4 wherein similar features or elements are denoted by similar reference numerals. An SOI substrate 101 is formed comprising substrate 10, buried insulation layer 11, such as silicon oxide, and an upper crystalline silicon layer 12. The upper silicon layer 12 typically has a thickness of about 100 Å to about 1000 Å. A gate electrode 14 is formed on the upper silicon layer 12 with a gate insulating layer 13 therebetween. As illustrated in FIG. 1, Xe ion implantation is conducted to preamorphize an upper portion of upper silicon layer 12 down to a projection depth forming an amorphous region 12A on each side of gate electrode 14. Embodiments of the present invention include preamorphizing the upper silicon layer 12 to a depth up to about 400 Å, e.g., about 50 to 300 Å, as well as down to buried insulating layer 11.

Subsequently, ion implantation of a dopant species is conducted, such as an N-type dopant, e.g., arsenic or phosphorus, as illustrated by arrows 20. Typically, such ion implantation is conducted at an implantation dosage of about $1 \times 10^{14}$ to about $5 \times 10^{14}$ ions/cm$^2$ and an implantation energy of about 200 eV to about 10 KeV, to form shallow source/drain extension implants. Annealing is then conducted, as at a temperature of about 500° C. to about 650° C., e.g., about 550° C. to about 600° C., to activate source/drain extensions 21 and recrystallize amorphous regions 12A. Typically, the source/drain extension 21 extend from the surface of upper silicon layer 12 to a depth of about 50 Å to about 300 Å.

Figure 3:
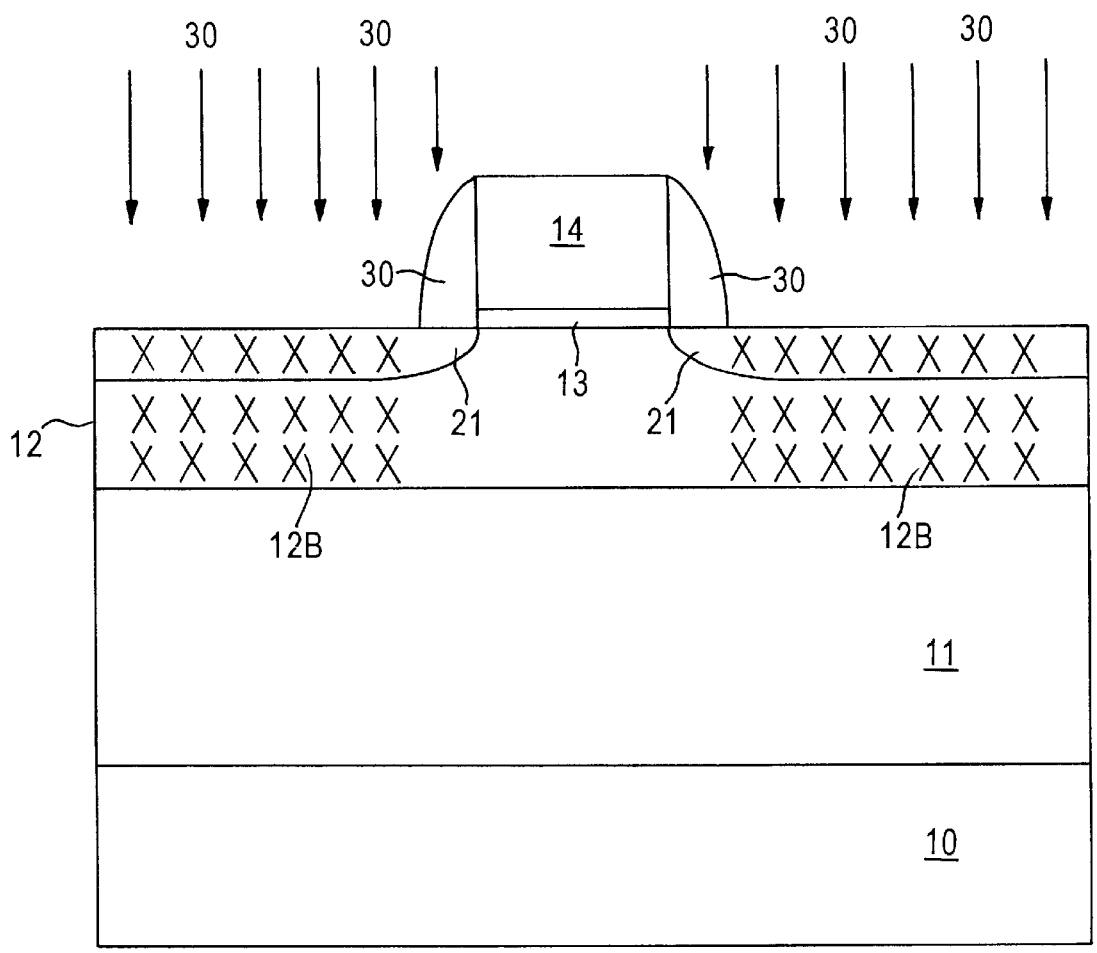

Subsequently, sidewall spacers 30 are formed on the side surfaces of gate electrode 14, as shown in FIG. 3. Sidewall spacers 30 can comprise an insulating material such as silicon oxide or silicon nitride. Xe ion implantation is again conducted, as indicated by arrows 30, to form amorphous regions 12B adjoining source/drain extensions 21. Such Xe implantation can be performed under the conditions previously disclosed with respect to FIG. 1.

Figure 4:
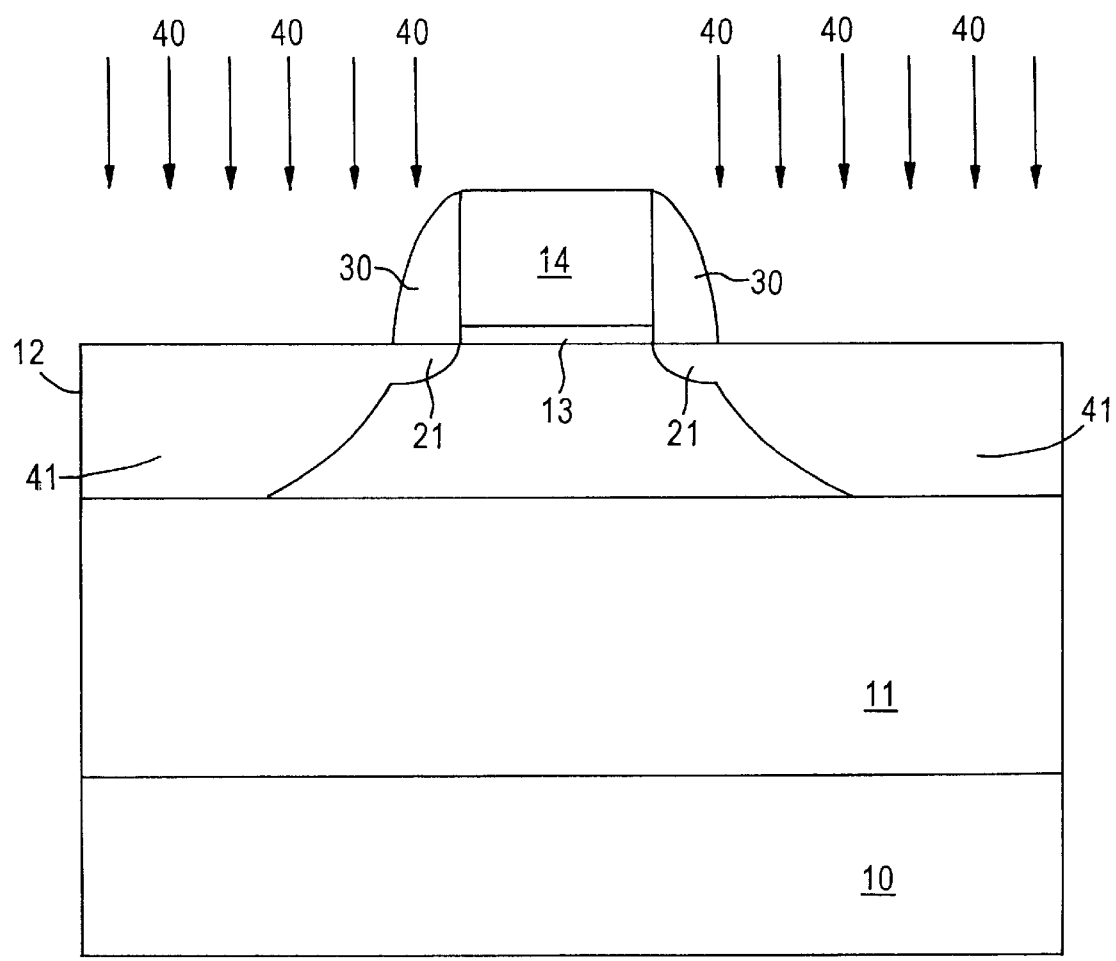

Subsequently, as illustrated in FIG. 4, ion implantation is conducted, as indicated by arrows 40, to form source/drain implants, typically at an implantation dosage of about $1 \times 10^{14}$ to about $5 \times 10^{14}$ ions/cm$^2$ and an implantation energy of about 10 KeV to about 60 KeV. Annealing is then conducted, as at a temperature of about 500° C. to about 650° C., to activate source/drain regions 41 and to recrystallize amorphous regions 12B. The use of Xe ion implantation for preamorphization in fabricating semiconductor devices on an SOI structure advantageously eliminates or significantly reduces floating body effects, thereby improving device reliability.

Figure 5:
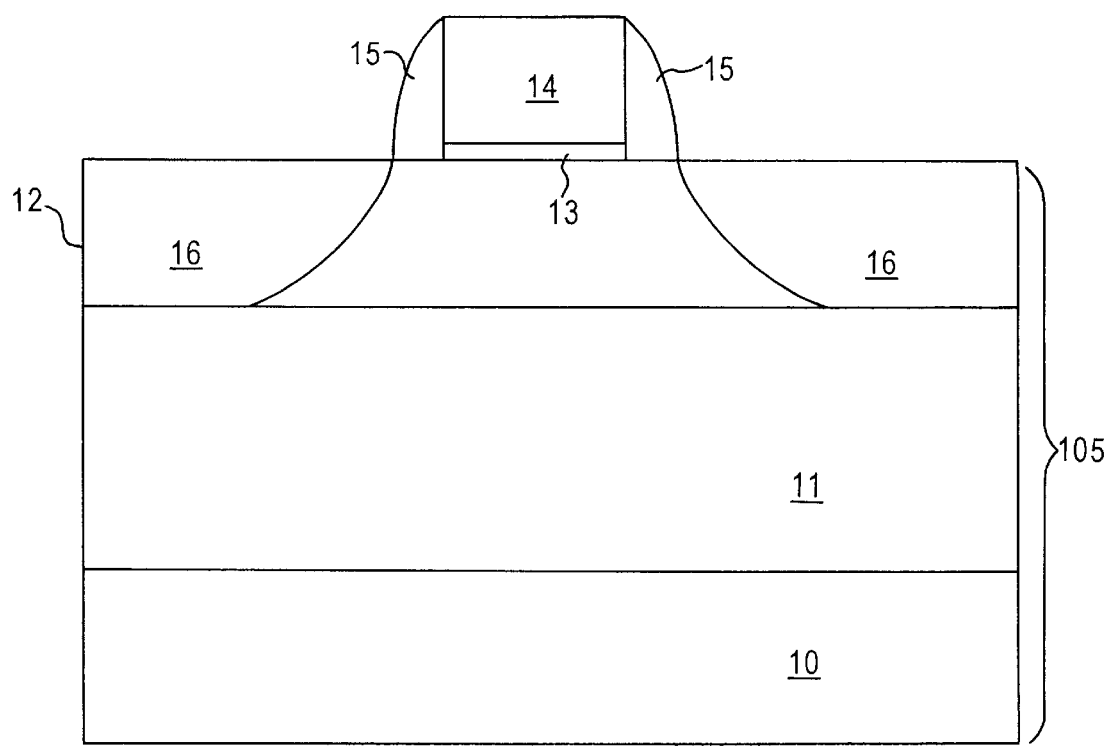
FIGS. 5 and 6 schematically illustrate sequential phases of a method in accordance with another embodiment of the present invention.
Figure 6:
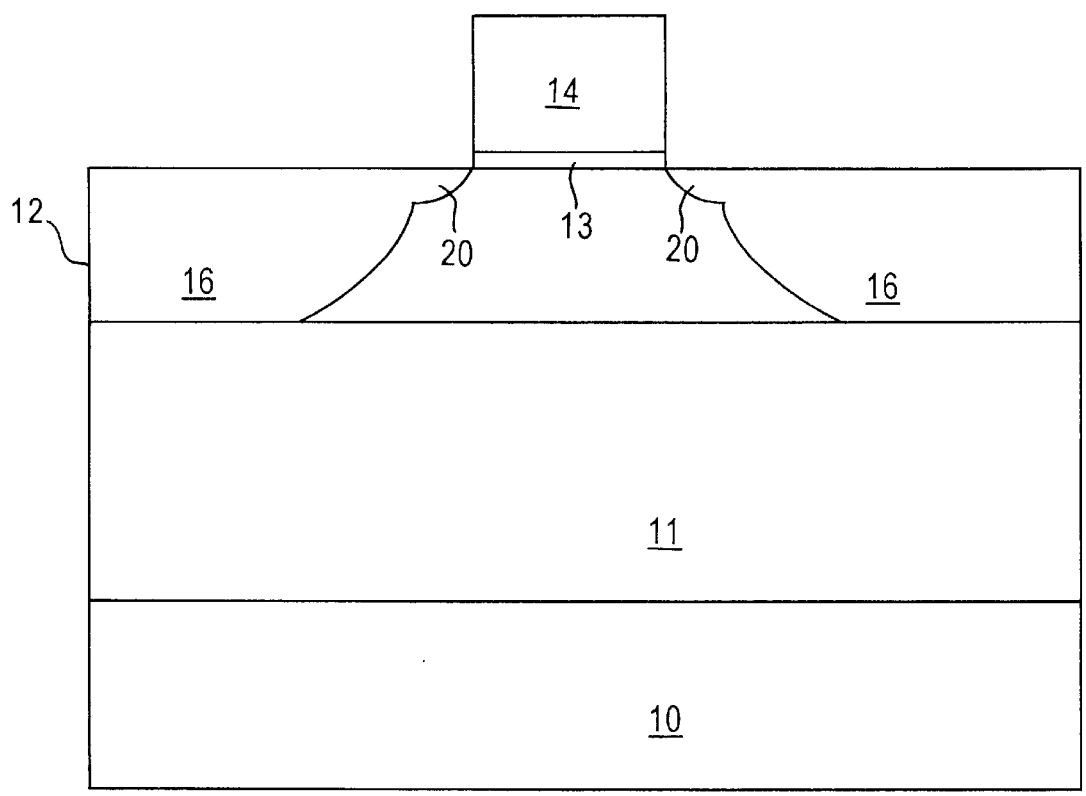

In the embodiment illustrated in FIGS. 1 through 4, the source/drain extensions are formed prior to forming the source/drain regions. However, in view of the very low annealing temperature which can be advantageously employed for dopant activation due to Xe ion implantation, a removable spacer technique can be employed to form the source/drain regions prior to forming the source/drain extensions. Such an embodiment is schematically illustrated in FIGS. 5 and 6, wherein similar features and similar elements are denoted by similar reference numerals, as are the elements and features employed in FIGS. 1 through 4. Adverting to FIG. 5, an SOI structure 105 is formed comprising substrate 10, buried insulating layer 11, and upper crystalline silicon layer 12. Gate electrode 14 is formed over upper silicon layer 12 with a gate insulating layer 13 therebetween. Sidewall spacers 15 are then formed on the side surfaces of gate electrode 14 and gate insulating layer 13. Xe ion implantation is then conducted to amorphize regions of upper crystalline layer 12 down to the buried insulating layer 11 on opposite sides of the sidewall spacers 15, followed by ion implantation to form source/drain implants and then annealing, as at a temperature of about 500° C. to about 650° C., to form source/drain regions 16.

Subsequently, sidewall spacers 15 are removed, as illustrated in FIG. 6, Xe ion implantation is again conducted to form upper amorphous regions in upper silicon layer 12 down to a projection depth followed by dopant ion implantation to form source/drain extension implants. Embodiments of the present invention include forming the amorphous regions to a depth up to about 400 Å, e.g., about 50 Å to about 300 Å, as well as down to buried insulating layer 11. Annealing is then conducted, as at a temperature of about 500° C. to about 650° C., to activate source/drain extensions 20 and recrystallize the amorphous regions resulting in the structure shown in FIG. 6.

Another aspect of the present invention comprises preamorphizing by ion implanting xenon dimer ($Xe_2^+$), thereby enabling the formation of ultra-shallow junction depths as well as accurately controlled source/drain extensions and regions. The $Xe_2^+$ is extracted from a Xe source at a low attraction voltage and analyzed by an analyzer magnet within the ion implantation device. The use of $Xe_2^+$ for preamophization in accordance with embodiments of the present invention includes not only SOI structures but conventional substrate structures as well, e.g., bulk silicon structures.

Figure 7:
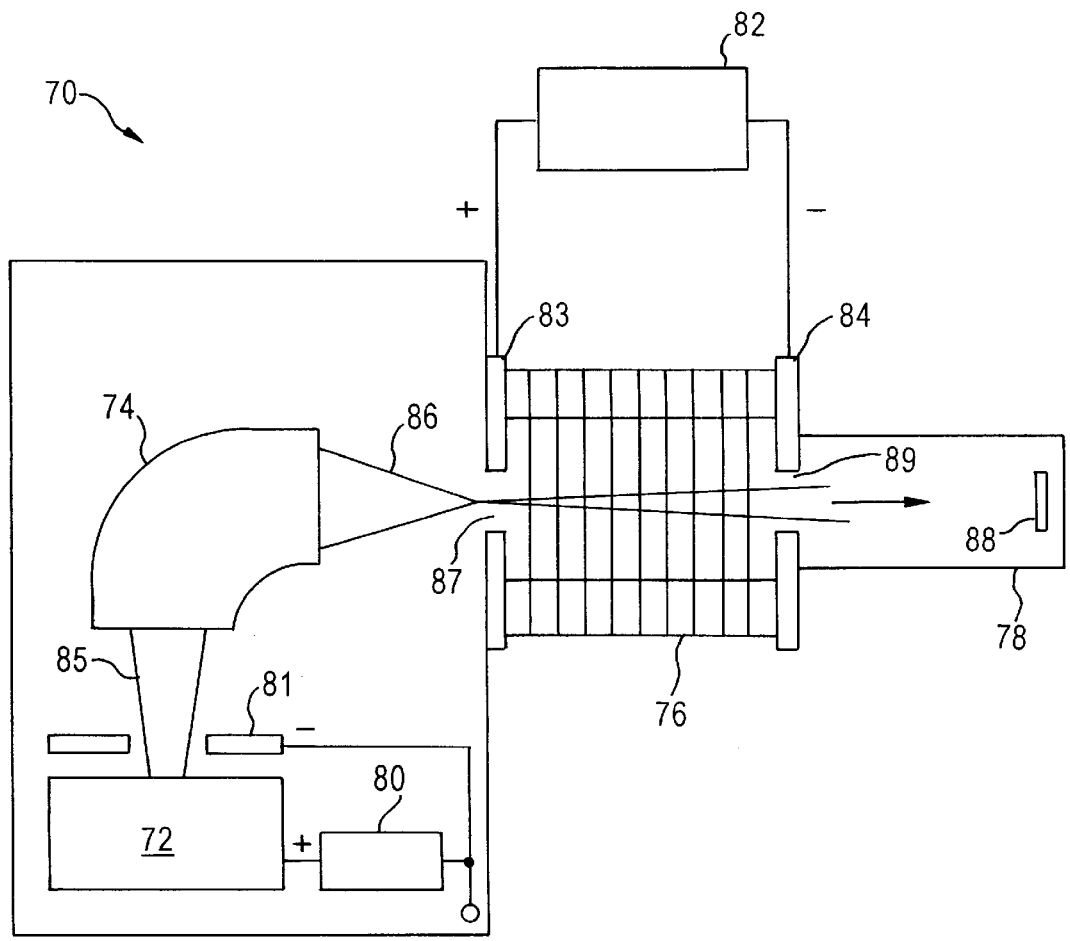
FIG. 7 schematically illustrates an ion implantation apparatus suitable for use in embodiments of the present invention.

A top plan view of an ion implantation system for implementing embodiments of the present invention comprising $Xe_2^+$ ion implantation is schematically illustrated in FIG. 7. As shown, the ion implantation system 70 includes a source chamber 72, an analyzer magnet 74, an accelerator 76 and an end station 78. An extraction power supply 80 is electrically coupled to an extraction electrode 81 and to an ion source (not shown) contained within source chamber 72. An acceleration power supply 82 is electrically coupled to acceleration electrodes 83 and 84 at opposite ends, respectively, of accelerator 76.

In operation, extraction electrode 81 extracts an incident ion beam 85 from source chamber 72. Incident ion beam 85 is analyzed by analyzer magnet 74, wherein a desired ion species is selected from ion beam 85. Analyzing magnet 74 emits analyzed ion beam 86, and directs the beam toward an aperture 87 located in electrode 83. Analyzer magnet 74 filters all but a single desired species from incident ion beam 85 to form an analyzed ion beam 86. A magnetic field created within analyzer magnet 74 causes each ion in ion beam 85 to follow an arching trajectory while traveling through analyzer magnet 74. The radius of the trajectory of a given ion depends upon the mass and velocity of the ion, along with the strength the magnetic field within analyzer magnetic 74. A mechanical obstruction within analyzer magnet 74 blocks all ions with trajectories that do not have the proper curvature to pass through the exit end of analyzing magnetic 74. Therefore, only the desired ions ($Xe_2^+$) exit analyzing magnetic 74 to form analyzed ion beam 86.

Upon entering aperture 87, analyzed ion beam 86 is accelerated by accelerator to 76 and directed toward end station 78. It should be recognized that commercial ion implantation systems typically include additional focusing systems to properly focus the beam after the beam exits accelerator 76. It should also be recognized that many different types of end station configurations are possible, depending upon the particular beam accurent capable of the ion implantation system.

Although initially accelerated by extraction electrode 81, ions can be further accelerated by accelerator 76 to a specified energy level depending upon the desired implantation depth. Typically extraction voltages for $Xe_2^+$ range from about 10 KeV to about 80 KeV, e.g., about 20 KeV to about 50 KeV.

In performing ion implantation, a substrate, such as a bulk silicon substrate 88, is placed within end station 78 in alignment with analyzed ion beam 86. Prior to actual ion implantation, end station 78 is evacuated to remove ambient gases from the vicinity of silicon substrate 88. During $Xe_2^+$ implantation, the analyzed ion beam 86 exits through aperture 89 in electrode 84. Aperture 89 allows gaseous communication between end station 78 accelerator 76.

In accordance with the embodiments of the present invention, the full spectrum generated from a Xe source is most distinctly obtained by operating the extraction voltage at relatively low values of about 10 KeV to about 50 KeV or lower.

The substrate 88 shown in FIG. 7 can be any type of conventional substrate, including a bulk silicon substrate. The sequence of amorphizing a bulk silicon substrate employing $Xe_2^+$ with formation of source/drain extensions and regions can parallel the sequence illustrated in FIGS. 1 through 4 or the sequence illustrated in FIGS. 5 and 6. It should be recognized that the substrate 88 shown in FIG. 7 can also be an SOI structure, and the $Xe_2^+$ ion implantations employed with respect to the embodiment illustrated in FIGS. 1 through 4 and the embodiment illustrated in FIGS. 5 and 6 can be conducted employing a $Xe_2^+$. In implementing $Xe_2^+$ ion implantation, a lower implantation energy can be employed than when implementing Xe ion implantation, since the implantation energy is divided between two ions. Accordingly, in preamorphizing employing a $Xe_2^+$, an energy of about 1 KeV to about 200 KeV can be effectively employed.

The present invention enables the manufacture of semiconductive devices having an SOI structure with virtually no or considerably reduced floating body effects, and accurately positioned and dimensioned source/drain extensions and regions. The present invention also provides efficient methodology for forming accurately positioned and dimensioned source/drain extensions in bulk silicon substrates having an ultra-shallow junction, such as less than about 400 Å, e.g., no greater than about 250 Å. The use of Xe ion implantation for preamorphization enables superior activation of dopant impurities, thereby enhancing device liability and improving wafer-to-wafer uniformity.

The present invention enjoys industrial applicability in the fabrication of various types of semiconductor devices. The present invention is particularly applicable to manufacturing semiconductor devices having submicron features.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as disclosed herein.

What is claimed is:

1. A method of manufacturing a semiconductor device, the method comprising:

forming a silicon-on-insulator (SOI) structure comprising:
   a lower silicon substrate;
   a buried insulating layer on the substrate; and
   an upper layer of crystalline silicon on the insulating layer;

ion implanting xenon (Xe) into the upper silicon layer to form an amorphous region therein extending from an upper surface toward the buried insulating layer;

ion implanting dopant impurities to form source/drain extension implants;

annealing to activate shallow source/drain extensions and to crystallize the amorphous region;

ion implanting Xe into the upper silicon layer to form an amorphous region therein extending from the upper surface toward the buried insulating layer;

ion implanting dopant impurities to form source/drain implants, separately from ion implanting the dopant impurities to form the source/drain extension implants; and annealing to activate source/drain regions and crystallize the amorphous region.

2. The method according to claim 1, wherein the buried insulating layer comprises silicon oxide.

3. The method according to claim 1, comprising ion implanting Xe at an implantation dosage of about $1\times10^{14}$ to about $5\times10^{14}$ ions/cm$^2$ and an implantation energy of about 3 KeV to about 150 KeV.

4. The method according to claim 1, comprising:

forming a gate electrode over the upper silicon layer with a gate insulating layer therebetween;

ion implanting dopant impurities into the amorphous region to form the source/drain extension implants;

annealing to activate the source/drain extensions and to recrystallize the amorphous region;

forming sidewall spacers on side surfaces of the gate electrode over the source/drain extensions;

ion implanting Xe to form amorphous regions in the upper silicon layer adjacent the source/drain extensions;

ion implanting dopant impurities into the amorphous regions to form source/drain implants; and annealing to activate the source/drain regions and to crystallize the amorphous regions.

5. The method according to claim 4, comprising annealing at a temperature of about 500° C. to about 650° C. to activate the source/drain extensions and source/drain regions.

6. The method according to claim 1, comprising:

forming a gate electrode over the upper silicon layer with a gate insulating layer therebetween;

forming sidewall spacers on side surfaces of the gate electrode;

ion implanting dopant impurities into the amorphous region of the upper silicon layer to form spaced apart source/drain implants;

annealing to activate the source/drain regions and to recrystallize the amorphous region;

removing the sidewall spacers;

ion implanting Xe into the upper silicon layer to amorphize regions between the side surfaces of the gate electrode and source/drain regions;

ion implanting dopant impurities into the amorphous regions to form source/drain extension implants; and annealing to activate the source/drain extensions and to recrystallize the amorphous regions.

7. The method according to claim 6, comprising annealing at a temperature of about 500° C. to about 650° C. to activate the source/drain extensions and source/drain regions.

8. The method according to claim 1, comprising annealing at temperature of about 500° C. to about 650° C. to activate the source/drain extensions and source/drain regions, and to recrystallize the amorphous region.

9. The method according to claim 1, comprising ion implanting Xe by:

providing an ion beam consisting essentially of xenon dimer (Xe$_2^+$); and implanting the Xe$_2^+$ into the upper crystalline silicon layer to form the amorphous region therein.

10. The method according to claim 9, comprising implanting the Xe dimer at an implantation dosage of about $1\times10^{14}$ to about $5\times10^{14}$ ions/cm$^2$ and at an implantation energy of about 1 KeV to about 200 KeV.

11. A method of manufacturing a semiconductor device, the method comprising:

providing an ion beam consisting essentially of xenon dimer (Xe$_2^+$);

implanting the Xe$_2^+$ into a crystalline semiconductor substrate to amorphize a region therein;

ion implanting a dopant impurity into the amorphous region to form source/drain extension implants and source/drain implants; and annealing to activate the source/drain extensions and source/drain regions, and to recrystallize the amorphous region.

12. The method according to claim 11, providing the ion beam consisting essentially of Xe$_2^+$ by:

extracting a first Xe ion beam from an ion source;

analyzing the Xe ion beam;

selecting singularly charged Xe$_2^+$ from the first ion beam to form the ion beam consisting essentially of Xe$_2^+$.

13. The method according to claim 11, comprising annealing at a temperature of about 500° C. to about 650° to activate the source/drain extensions and source/drain regions and to crystallize the amorphous region.

14. The method according to claim 11, comprising:

implanting the Xe$_2^+$ into the crystallized substrate to form amorphous regions extending from an upper surface of the substrate to a depth no greater than about 400 Å;

implanting the dopant impurities into the amorphized regions to form the source/drain implants;

annealing at a temperature of about 500° C. to about 650° C. to activate the source/drain extensions.

15. The method according to claim 14, comprising forming the amorphous regions to a depth no greater than about 250 Å.

16. The method according to claim 15, comprising forming the amorphous regions at a depth of about 100 Å to about 250 Å.

17. The method according to claim 11, comprising forming a gate electrode over an upper surface of the substrate with a gate insulating layer therebetween;
  ion implanting dopant impurities into the amorphous region to form the source/drain extension implants;
  annealing to activate the source/drain extensions and to recrystallize the amorphous region;
  forming sidewall spacers on side surfaces of the gate electrode over the source/drain extensions;
  ion implanting $Xe_2^+$ to form amporhous regions adjacent the source/drain extensions;
  ion implanting dopant impurities into the amorphous regions to form source/drain implants; and
  annealing to form the source/drain regions and to recrystallize the amorphous regions.

18. The method according to claim 17, comprising annealing at a temperature at about 500° C. to about 650° C. to activate the source/drain extensions and regions.

19. The method according to claim 11, comprising:
  forming a gate electrode over an upper surface of the substrate with a gate insulating layer therebetween;
  forming sidewall spacers on side surfaces of the gate electrode;
  ion implanting dopant and impurities into the amorphous region to form spaced apart source/drain implants;
  annealing to activate the source/drain regions and recrystallize the amorphous regions;
  removing the sidewall spacers;
  ion implanting $Xe_2^+$ into the substrate to amorphize regions between side surfaces of the gate electrode and source/drain regions;
  ion implanting dopant impurities into the amorphized regions to form source/drain extension implants; and
  annealing to activate the source/drain extensions and to recrystallize the amorphous regions.

20. The method according to claim 19, comprising annealing at a temperature of about 500° C. to about 650° C. to activate the source/drain extensions and regions.

* * * * *